United States Patent
Rzehak

(10) Patent No.: US 7,689,374 B2
(45) Date of Patent: Mar. 30, 2010

(54) POLYPHASE ELECTRIC ENERGY METER

(75) Inventor: Volker Rzehak, Ergolding (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 11/963,546

(22) Filed: Dec. 21, 2007

(65) Prior Publication Data
US 2008/0215262 A1 Sep. 4, 2008

(30) Foreign Application Priority Data
Jan. 5, 2007 (DE) .................. 10 2007 001 221

(51) Int. Cl.
*G01R 21/00* (2006.01)
*G01R 21/06* (2006.01)
*G01R 19/00* (2006.01)

(52) U.S. Cl. .......................... 702/60; 702/64

(58) Field of Classification Search ................ 702/57, 702/60, 64, 65; 327/100, 103; 324/76.11, 324/107, 142
See application file for complete search history.

(56) References Cited

U.S. PATENT DOCUMENTS

| | | | |
|---|---|---|---|
| 5,691,634 A * | 11/1997 | Lowe ........................ | 324/107 |
| 6,058,354 A * | 5/2000 | Adame et al. ................ | 702/60 |
| 6,112,159 A | 8/2000 | Bond et al. | |
| 6,377,037 B1 | 4/2002 | Burns et al. | |
| 6,483,290 B1 | 11/2002 | Hemminger et al. | |
| 6,657,424 B1 | 12/2003 | Voisine et al. | |
| 7,425,994 B2 * | 9/2008 | Haider et al. ................ | 348/572 |
| 7,474,087 B2 * | 1/2009 | Fritz .......................... | 324/142 |
| 2003/0036864 A1 | 2/2003 | Randall et al. | |
| 2004/0032357 A1 | 2/2004 | White | |
| 2004/0183522 A1 | 9/2004 | Gunn et al. | |
| 2004/0186672 A1 | 9/2004 | Howell et al. | |
| 2005/0134490 A1 * | 6/2005 | Cox .......................... | 341/141 |
| 2005/0225469 A1 | 10/2005 | White | |
| 2008/0186013 A1 * | 8/2008 | Rzehak et al. .............. | 324/107 |

FOREIGN PATENT DOCUMENTS

| | | |
|---|---|---|
| DE | 19713120 | 10/1998 |
| EP | 1545009 | 6/2005 |
| WO | 9844355 A | 10/1998 |
| WO | 9944071 A1 | 9/1999 |
| WO | 0177695 A2 | 10/2001 |

* cited by examiner

*Primary Examiner*—Michael P Nghiem
(74) *Attorney, Agent, or Firm*—John J. Patti; Wade J. Brady, III; Frederick J. Telecky, Jr.

(57) ABSTRACT

A polyphase electric energy meter is provided that includes a microcontroller with a front end that converts analog current input signals and analog voltage input signals to digital current and voltage samples for processing by the microcontroller. The front end includes separate input channels, each for one of the current input signals with a sigma-delta modulator followed by a decimation filter. The front end further includes a common input channel for all voltage input signals with a multiplexer, an analog-to-digital converter and a de-multiplexer. The separate input channels and the common input channel provide the digital current and voltage samples for processing by the microcontroller.

7 Claims, 2 Drawing Sheets

POLYPHASE ELECTRIC ENERGY METER

The invention relates to a polyphase electric energy meter.

BACKGROUND

In a typical three-phase electric energy meter current input signals are derived from the three phases with current transformers and voltage input signals are derived from the three phases with a resistive voltage divider. The current and voltage input signals are sampled and the current samples are multiplied with the voltage samples to obtain electric energy samples which are cumulated to provide an indication representative of consumed electric energy.

In an advanced electric energy meter the current and voltage input signals are converted to digital input samples for further processing by a microcontroller. One straight-forward approach is to use separate input channels, each for one of the three current or voltage input signals and each with an analog-to-digital converter (ADC). In this "synchronous" approach all input signals are processed in parallel and synchronously. With high accuracy requirements over a large dynamic range, e.g. smaller than 1% over a range of 1:2000, high resolution (at least 16-bit) ADCs are needed that are usually implemented with a sigma-delta modulator followed by a decimation filter. While the approach promises to be successful, it requires a large die space and is expensive. An alternative approach is to use a single high resolution ADC with an input multiplexer and an output de-multiplexer. In this "sequential" approach the current and voltage input signals are sequentially switched to the input of the ADC and the resulting digital samples are corrected in phase to compensate for the delays introduced by the sequential sampling. The sequential approach needs less die space, but requires a complex analog-to-digital converter to combine the high resolution requirements with the need to multiplex through all current and voltage signals.

SUMMARY

The invention provides a polyphase electric energy meter comprising a microcontroller with a front end that offers high resolution at moderate die space requirements.

Specifically, the polyphase electric energy meter of the invention comprises a microcontroller with a front end that converts analog current input signals and analog voltage input signals to digital current and voltage samples for processing by the microcontroller. The front end includes separate input channels, each for one of the current input signals with a high resolution analog-to-digital converter, preferably a sigma-delta modulator followed by a decimation filter. The front end further includes a common input channel for all voltage input signals with a multiplexer, an analog-to-digital converter and a de-multiplexer. The separate input channels and the common input channel provide the digital current and voltage samples for processing by the microcontroller.

The invention is based on the understanding that only the current input signals, due to their possibly high dynamic range, need an analog-to-digital conversion at a high resolution and that the voltage input signals with their small dynamic range can be sampled sequentially at a moderate resolution. Thus, for a three-phase meter, only three high resolution are needed ADCs for the three current input signals and a single ADC of a moderate resolution for the voltage input signals.

In a preferred embodiment, the multiplexer has one input for each voltage input signal and at least one additional input for an auxiliary input signal such as a temperature signal or a battery voltage signal. Since the voltage samples are taken at a moderate rate, the multiplexer can be implemented with additional time slots so that more than just the voltage input signals can be processed in the single common input channel.

When an application requires the neutral current to be measured in addition to the three live currents, the front end comprises three of the separate input channels, each for one of three current phases, and an additional separate input channel for the neutral current input signal. Alternatively the multiplexed ADC can be used if a reduction of accuracy for the conversion of the neutral current is acceptable.

BRIEF DESCRIPTION OF THE DRAWINGS

Further advantages and features of the invention will become apparent from the following detailed description with reference to the appended drawings, wherein.

DETAILED DESCRIPTION OF EXAMPLE EMBODIMENTS

Figure 1:
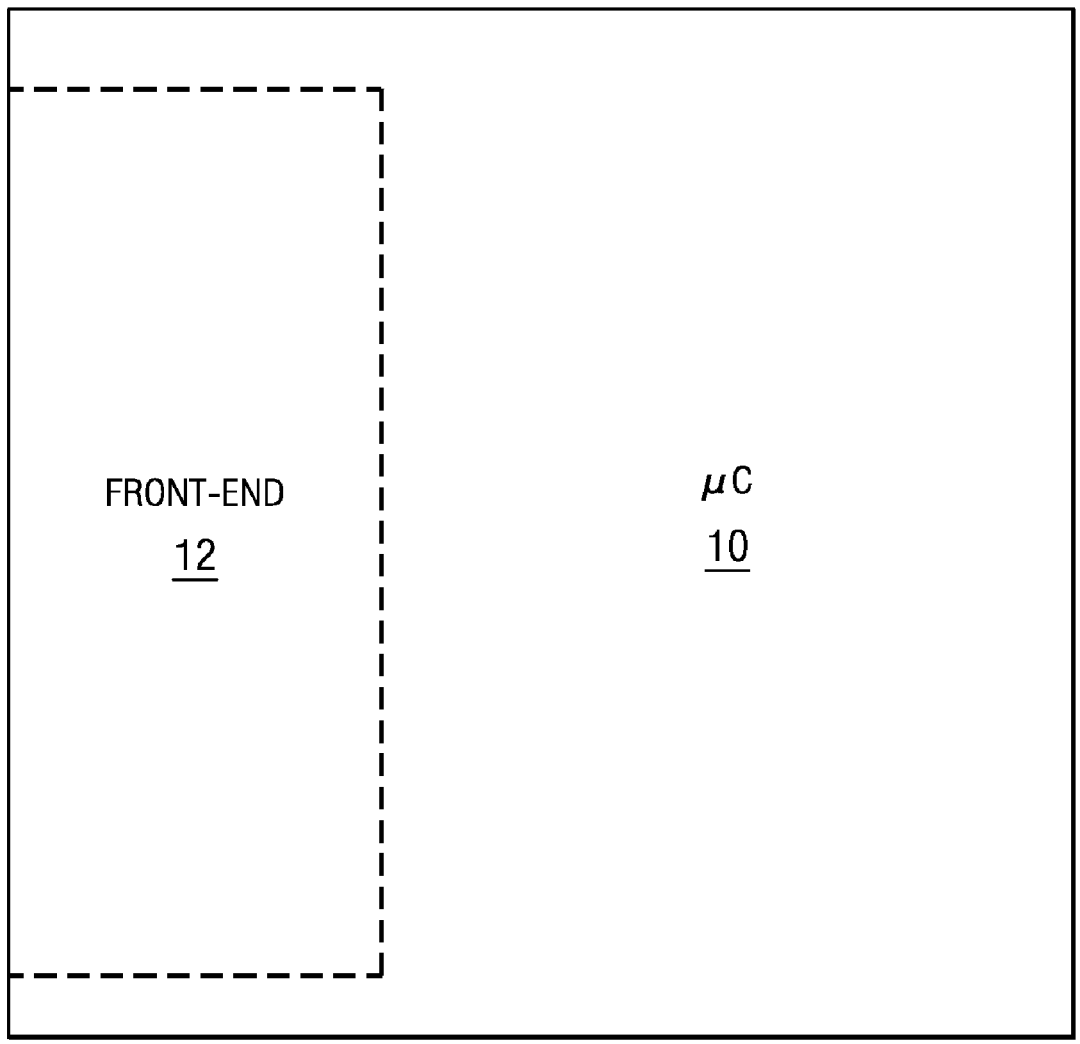
FIG. 1 is a schematic block diagram of a microcontroller incorporating a front-end.

The microcontroller 10 generally shown in FIG. 1 includes a front-end 12 which has a plurality of analog inputs and a plurality of digital outputs. The analog inputs are adapted to receive external analog input signals and the digital outputs are internal to the microcontroller for further processing therein.

Figure 2:
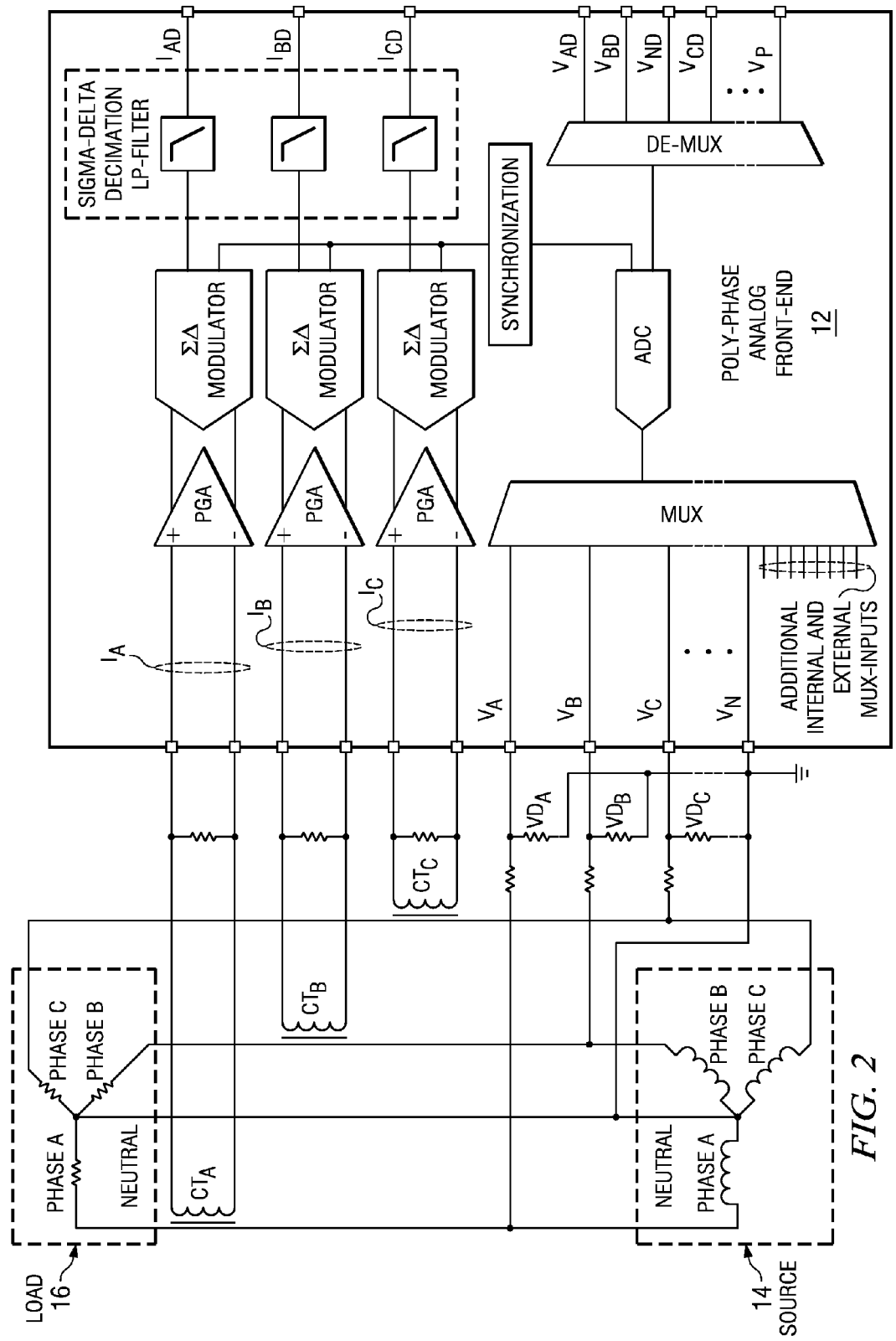
FIG. 2 is a block diagram of a polyphase electric energy meter implemented with a microcontroller as illustrated in FIG. 1.

With reference to FIG. 2, the front-end 12 includes three parallel input channels, each with a fully differential programmable gain amplifier PGA and a sigma-delta modulator followed by a decimation low-pass filter. The differential inputs of the amplifier PGA receive analog current input signals $I_A$, $I_B$ and $I_C$, respectively, and the decimation filters provide corresponding digital current output samples $I_{AD}$, $I_{BD}$ and $I_{CD}$, respectively.

The front-end 12 further includes a multiplexer MUX with four analog inputs receiving voltage input signals $V_A$, $Y_B$, $V_C$ and $V_N$, respectively, and a number of further optional inputs for application of auxiliary external or internal signals. The output of multiplexer MUX is connected to the input of an analog-to-digital converter ADC, the digital output of which is connected to a de-multiplexer De-MUX. The de-multiplexer De-MUX provides digital voltage samples $V_{AD}$, $V_{BD}$, $V_{CD}$, and $V_{ND}$, respectively, and one or more optional parameter samples P.

A block "Synchronization" in the front-end 12 synchronizes operation of all sigma-delta modulators, of the multiplexer MUX and de-multiplexer De-MUX, and of the ADC.

The electric energy meter is connected to the three phases A, B and C of a three-phase power source 14 which feeds a three-phase load 16. Specifically, each phase has an associated current transformer $CT_A$, $CT_B$ and $CT_C$, respectively, and a resistive voltage divider $VD_A$, $VD_B$ and $VD_C$, respectively. In a well-known manner, the current transformers $CT_A$, $CT_B$ and $CT_C$ generate the current input signals $I_A$, $I_B$ and $I_C$, and the voltage dividers $VD_A$, $VD_B$ and $VD_C$ provide the voltage input signals $V_A$, $V_B$, $V_C$. The neutral voltage signal $V_N$ is applied directly to a corresponding input of the multiplexer MUX. Optional input signals such as external parameters (temperature, battery voltage, etc.) or internal analog signals are applied to further inputs of multiplexer MUX.

In operation, the analog current and voltage input signals are converted to digital samples for further processing by the microcontroller. Specifically, the current input signals are analog-to-digital converted at a high resolution (e.g., at least 16-bit resolution) in parallel and synchronously by the three separate input channels, each with a programmable gain amplifier and a sigma-delta modulator followed by a decimation filter. Thus, three digital current samples $I_{AD}$, $I_{BD}$ and $I_{CD}$ are available at the output of the front-end 12. In turn, the voltage input signals are sequentially applied to the ADC, which may have a moderate resolution of, e.g., 12 bits, and corresponding digital voltage samples $V_{AD}$, $V_{BD}$ and $V_{CD}$ are available at the outputs of the de-multiplexer De-MUX.

The digital current and voltage samples at the output of the front-end 12 are further processed by the microcontroller by means of software which accounts for the delays of the multiplexed voltage samples.

In some applications, an additional input channel is included with an associated further current transformer placed in the neutral line. This additional input channel may be similar to the three separate input channels and include a programmable gain amplifier followed by a sigma-delta modulator and a low-pass decimation filter.

Those skilled in the art to which the invention relates will appreciate that the described embodiments are merely representative embodiments and that there are variations of the described embodiments and other embodiments within the scope of the claimed invention.

What is claimed is:

1. A polyphase electric energy meter, comprising:
   a microcontroller with a front end that converts analog current input signals and analog voltage input signals to digital current and voltage samples for processing by the microcontroller, the front end including:
   separate input channels, each for one of the current input signals and having a high resolution analog-to-digital converter; and
   a multiplexer combining all voltage input signals into a common input channel to an another analog-to-digital converter and a de-multiplexer connected to the another analog-to-digital converter, wherein the separate input channels and the common input channel provide the digital current and voltage samples for processing by the microcontroller.

2. The meter of claim 1, wherein the high resolution analog-to-digital converter in each of the separate input channels is a sigma-delta modulator followed by a decimation filter.

3. The meter of claim 2, wherein the multiplexer has one input for each voltage input signal and at least one additional input for an auxiliary input signal.

4. The meter of claim 3, wherein the front end comprises three of the separate input channels, each for one of three current phases, and an additional separate input channel for a neutral current input signal.

5. The meter of claim 2, wherein the front end comprises three of the separate input channels, each for one of three current phases, and an additional separate input channel for a neutral current input signal.

6. The meter of claim 1, wherein the multiplexer has one input for each voltage input signal and at least one additional input for an auxiliary input signal.

7. The meter of claim 1, wherein the front end comprises three of the separate input channels, each for one of three current phases, and an additional separate input channel for a neutral current input signal.

* * * * *